US007882462B2

(12) United States Patent
Ogilvie et al.

(10) Patent No.: US 7,882,462 B2
(45) Date of Patent: Feb. 1, 2011

(54) HARDWARE DEFINITION LANGUAGE GENERATION FOR FRAME-BASED PROCESSING

(75) Inventors: Brian K. Ogilvie, Holliston, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 746 days.

(21) Appl. No.: 11/519,290

(22) Filed: Sep. 11, 2006

(65) Prior Publication Data

US 2008/0066046 A1 Mar. 13, 2008

(51) Int. Cl.
*G06F 17/50* (2006.01)
(52) U.S. Cl. .................................. 716/3; 716/4; 716/18
(58) Field of Classification Search .................. 716/1–5, 716/9–13, 16–18; 703/15–16, 22–23; 345/418, 345/619, 762; 717/106, 140, 156
See application file for complete search history.

(56) References Cited

U.S. PATENT DOCUMENTS

| 5,701,294 | A | * | 12/1997 | Ward et al. .................... 370/252 |
| 5,920,711 | A | * | 7/1999 | Seawright et al. ............. 703/15 |
| 5,956,674 | A | | 9/1999 | Smyth et al. |
| 6,584,601 | B1 | * | 6/2003 | Kodosky et al. ................ 716/4 |
| 7,143,368 | B1 | | 11/2006 | Plofsky et al. |
| 2002/0080174 | A1 | * | 6/2002 | Kodosky et al. ............. 345/762 |
| 2002/0193078 | A1 | * | 12/2002 | MacFarlane Shearer et al. . 455/69 |
| 2003/0016234 | A1 | | 1/2003 | Mani et al. |
| 2004/0243964 | A1 | | 12/2004 | McElvain et al. |
| 2006/0225021 | A1 | * | 10/2006 | Padalia et al. .................. 716/17 |
| 2008/0098349 | A1 | * | 4/2008 | Lin et al. ...................... 717/106 |
| 2008/0189089 | A1 | * | 8/2008 | Lee ................................ 703/2 |
| 2008/0234995 | A1 | * | 9/2008 | Newcomb et al. ............. 703/11 |

OTHER PUBLICATIONS

Bjuréus, Per et al., "FPGA Resource and Timing Estimation from Matlab Execution Traces," International Conference on Hardware Software Codesign, Proceedings of the tenth international symposium on Hardware/sofrware codesign, pp. 31-36 (2002).

Nayak, Anshuman et al., "Accurate Area and Delay Estimators for FPGAs," Proceedings of the 2002 Design, Automation and Test in Europe Conference and Exhibition (Date'02), pp. 862-869 (2002).

Ou, Jingzhao et al., "PyGen: A MATLAB/Simulink Based Tool for Synthesizing Parameterized and Energy Efficient Designs Using FPGAs," *Proceedings of the 12th Annual IEEE Symposium on Field-Programmable Custom Computing Machines*, pp. 47-56 (2004).

(Continued)

*Primary Examiner*—Paul Dinh
(74) *Attorney, Agent, or Firm*—Cesari and McKenna, LLP; Michael R. Reinemann

(57) ABSTRACT

An automatic code generation application is used to automatically generate code and build programs from a textual model or graphical model for implementation on the computational platform based on the design. One or more model elements may be capable of frame-based data processing. Various options and optimizations are used to generate Hardware Description Language (HDL) code for the frame-based model elements.

9 Claims, 9 Drawing Sheets

OTHER PUBLICATIONS

International Search Report for Application No. PCT/US2007/019734, dated Nov. 11, 2008.

Banerjee, Prithviraj et al., "Overview of a Compiler for Synthesizing MATLAB Programs onto FPGAs," *IEEE Transactions on Very Large Scale Integration (VLSI) Systems*, vol. 12(3):312-324 (2004).

Haldar, Malay et al., "FPGA Hardware Synthesis from MATLAB," *Fourteenth International Conference on VLSI Design*, pp. 299-304 (2001).

Martins, Sérgio et al., "A high-level tool for the design of custom image processing systems," *Proceedings of the 2005 8th Euromicro conference on Digital System Design (DSD'05)*, pp. 346-349 (2005).

Portero, Antoni et al., "Study of High Level design methodologies for a MPEG frames I Compressor for a HW/SW Implementation," *2004 IEEE International Conference on Industrial Technology (ICIT)*, pp. 1688-1693 (2004).

Invitation to Pay Additional Fees for Application No. PCT/US2007/019734, dated May 6, 2008.

* cited by examiner

HARDWARE DEFINITION LANGUAGE GENERATION FOR FRAME-BASED PROCESSING

BACKGROUND OF THE INVENTION

The MATLAB® modeling environment is a product of The MathWorks, Inc. of Natick, Mass., which provides engineers, scientists, mathematicians, educators and other professionals across a diverse range of industries with an environment for technical computing applications. The MATLAB® programming language is an intuitive high performance language and technical computing environment that provides mathematical and graphical tools for mathematical computation, data analysis, visualization and algorithm development. MATLAB® is used to solve and/or understand complex engineering and scientific problems by developing mathematical models that simulate the problem. A model is prototyped, tested and analyzed by running the model under multiple boundary conditions, data parameters, or just a number of initial guesses.

Besides using a textual modeling environment, such as the MATLAB® modeling environment or SystemC, a user may use graphical modeling environments, such as the Simulink® modeling environment from The MathWorks, Inc. of Natick, Mass., to create a model. The Simulink® modeling environment supports block diagram modeling, and such block diagrams are commonly used to create models that represent a design or algorithm of an implementation for computational hardware or wetware. One or more block diagrams may represent a design for a target hardware platform. A "target hardware platform" may include a single computational hardware component or multiple computational hardware components. A target hardware platform may also have other elements such as memory, interfaces, or other integrated circuits (ICs). It may also have a number of such elements on one chip and be a so-called System on Chip (SoC). The term "computational hardware component" may generally be used to refer to any hardware component with computational capability, such as, for example, a digital signal processor (DSP), general-purpose processor (GPP), graphics processing unit (GPU), microcontroller, application specific integrated circuit (ASIC), application-specific instruction-set processor (ASIP), field-programmable gate arrays (FPGA), biocomputer, quantum computer, etc.

An automatic code generation application can automatically generate code and build programs from a textual model or graphical model for implementation on the computational platform based on the design.

The process of translating a model of a system into a system implementation is computationally intensive and ordinarily performed in many steps. In one approach, the elements of a graphical model are directly translated into an implementation representation. In another approach, an intermediate representation is used to facilitate this translation process. Intermediate representations typically allow for a change in levels of abstraction from a source language to a target language and a corresponding system implementation. The intermediate representation may be generated in memory and not written to file, or it may be captured on disk. Graphical modeling tools, such as those that are block diagram based, attempt to simplify the process of conceptualizing, designing, simulating and finally implementing in hardware computing systems. Such hardware systems may be, for example, custom signal processing systems. In a graphical context, a block diagram can be a representation of a real-world system through a diagram containing nodes referred to as "blocks" interconnected by lines. Blocks are functional entities that perform actions and transformations on data processed by the system. The lines represent data, called "signals," that are output and input of the various blocks.

Signal processing systems generally include a number of components that perform a series of signal operations or transformations to one or more input signals in order to obtain a set of desired output signals. This processing may be carried out using sample-based processing or frame-based processing.

In sample-based processing, each component acts upon one data sample of its input signal, acquired at one instant in time, every time it executes. A data sample may be scalar in nature, that is, a single data element. It may also be a vector, a matrix, a higher-dimensional regular array of data elements, etc. A data sample may also be irregular or non-uniform in structure, depending upon the nature of the intended application.

In frame-based processing, each component acts upon a collection of data samples acquired over time, every time it executes. The collection may have periodic sampling interval (that is, uniformly sampled over time) or may be aperiodic with respect to the sampling interval, that is, non-uniformly sampled over time. The temporal collection is known as a frame of data samples, and may be recorded in memory as a buffer.

Frame-based processing has several advantages over sample-based processing. It decreases the number of times components need to communicate with each other in order to process a given number of samples. It also may reduce the need for intricate storage and indexing facilities for blocks that perform frame-based operations. This reduction in communication decreases the messaging overhead between components both in software and hardware implementations of the overall system. Another scenario where frame-based processing reduces messaging overhead may be understood by considering a digital signal processing (DSP) system that is implemented as a cascade of a variety of components using an analog to digital (A/D) converter. In many scenarios, the A/D converter is serviced by an interrupt service routine (ISR). Each call to the ISR has a fixed performance overhead regardless of the number of samples obtained from the A/D converter at each interrupt. Therefore, it is beneficial to reduce the number of times the ISR is executed by bundling up frames of samples during each call to the ISR.

There are also a variety of signal operations and transformations that have more efficient algorithmic implementation when more than one sample is processed at each execution step of the algorithm. An example of such an operation is Finite Impulse Response (FIR) digital filtering, which may be implemented either through a direct sample-based convolution or through the frame-based Overlap-Add (OLA) algorithm.

Once the system designer has modeled a system using graphical block diagram based tools, it may be necessary to design the actual hardware system. Modern day electronic circuits may be described using a hardware description language (HDL).

"HDL" refers to any language from a class of computer languages for formal description of hardware. It can describe hardware operation, its design, and tests to verify its operation by means of simulation. HDL provides a standard text-based expression of the temporal behavior and/or spatial structure of the hardware. The syntax and semantics of an HDL include explicit notations for expressing time and concurrency, which are primary attributes of hardware.

Using the hardware description in HDL code, a software program called an HDL synthesis tool can infer hardware logic operations from the hardware description statements and produce an equivalent list of generic hardware primitives to implement the specified behavior.

SUMMARY OF THE INVENTION

One embodiment of the invention is directed towards processing a model, such as, for example, a graphical model containing one or more frame attributes and automatically generating HDL code for the graphical model. The frame-based processing mechanism allows blocks to take as input multiple data samples. In generating code for the frame-enabled blocks, various methods may be employed to implement frame-based processing.

In one embodiment, a block diagram designer or a modeling environment user may be asked to select among options for HDL generation for frame-enabled blocks. Such options may include preferences directed to the size of target hardware or desired processing latency. For example, the user may specify to minimize the size of the proposed hardware (as described by the HDL representation), in which case the code generated for a frame-capable block may include only one copy of the function of the block and a buffer for holding all necessary elements of the input frame. Alternatively, a user may specify to improve the latency of the operation of the target device, which may come at the cost of the size of the target hardware. In case of such a choice, more than one element performing the same function may be generated, each element accepting and processing a portion of the frame input.

In another embodiment, decisions regarding the size of the target hardware and/or latency may be made automatically, based on the general preferences. Such preferences may be attached to each individual block, or, in another embodiment, they may be specified on a per-model basis or per-subsystem basis. For example, the HDL generation mechanism may make automatic analysis of associated advantages and disadvantages of various hardware implementations and generate code on the basis of that analysis.

In yet another embodiment, the HDL representation generation mechanism may perform a block-per-block analysis to determine the best option for describing frame-like behavior in HDL. Some blocks may be easily parallelizable, such that their operation may be replicated in hardware, while other blocks may not be so easily parallelizable and may require a buffer storing input data while data is being processed on an individual basis.

The HDL representation is one of many possible intermediate representations of the model. In one embodiment, a first intermediate representation is generated after processing the model. The first intermediate representation may be optimized and/or analyzed to produce an optimized model or an optimized HDL representation. In an alternative embodiment, the model itself may be optimized in producing the intermediate representation.

In yet another embodiment, the user or the HDL generator may select options based on considered design tradeoff, such as, for example, hardware/software tradeoff. The model may be partitioned into two or more parts, and different code may be generated for each of the model parts. For example, a part of the model may result in generated HDL code, while another part may be converted to a high-level programming language.

DETAILED DESCRIPTION

Figure 1:
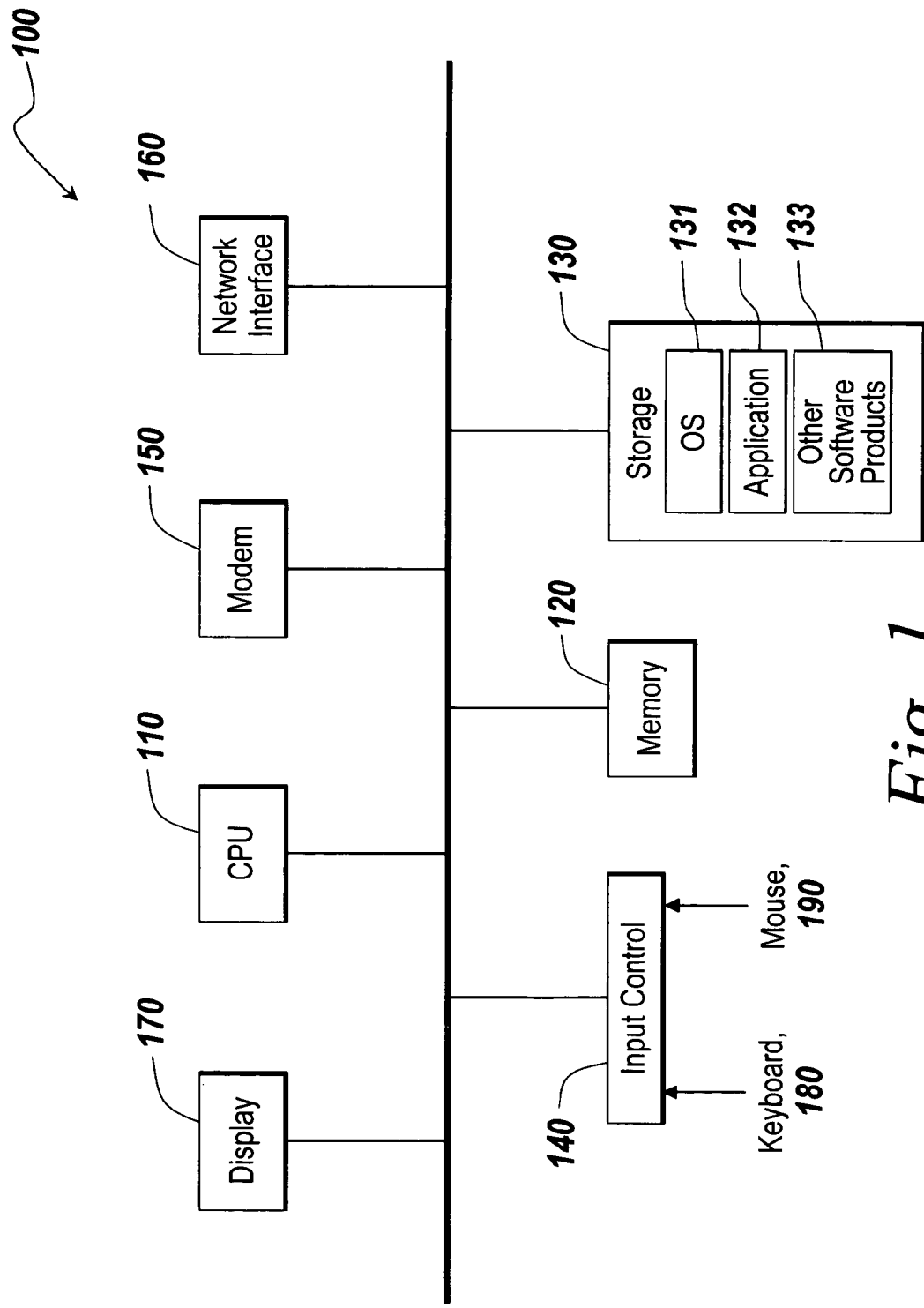
FIG. 1 is an exemplary computing device suitable for practicing the illustrative embodiment of the present invention.

The illustrative embodiment of the present invention provides for automatic code generation from a model containing one or more blocks adapted for frame-based processing. The illustrative embodiment automatically generates code for the hardware description of the model, including the blocks adapted for frame-based processing. The hardware description may be generated in a Hardware Description Language (HDL), such as a very high speed integrated circuit hardware description language (VHDL), Verilog, and other similar languages. Although the illustrative embodiment is described herein relative to HDL code, one of skill in the art will appreciate that the hardware description may be generated in other languages, including programming languages, such as C++, C, C#, SystemC, Java and Javascript. Similarly, although the illustrative embodiment is directed to generating hardware description language code from Simulink® and/or MATLAB® models, one of skill in the art will appreciate that any other graphical or textual modeling system may be used, such as, for example, SystemC modeling platform.

As referred herein, a "model" is a representation, whether simplified or not, of a system. The model may be graphical or textual, or a combination of graphical and textual elements. The system modeled may be any real-world or artificially constructed system.

When the code for the model is automatically generated, the signals in the model are typically processed in a sampled fashion. With a sample-based processing approach, each component consumes at most one sample of its input signal every time it executes. Signal processing systems which include, for example, image processing systems, generally consist of a cascade of components that perform a series of signal operations and transformations to one or more input signals in order to obtain a set of desired output signals. In most real world applications, such systems are required to carry out the processing in real time to produce samples of the output signals as samples of the input signals become available. This processing may be carried out using one of the following two approaches: sample-based processing (described above) or frame-based processing. With frame-based processing, each component consumes a batch or "frame" of contiguous samples of its input signal, potentially interspersed with duplicates, defaults, or other data samples, every time it executes.

A frame is a temporal collection of data samples that may be scalars, vectors or matrices, as well as multi-dimensional values, frames, and symbolic values. The data samples in the frame may be homogeneous or heterogeneous. A size of the frame may be described in terms of number of channels and number of samples in each channel. A channel is a collection of samples within the frame. The number of samples in each channel need not be equal, although it frequently is so.

Frames may sometimes be categorized as contiguous or discontiguous. The values of a frame-based signal are said to be made up of contiguous frames when the samples in one frame are contiguous in time to the samples in the previous and next frames. The values of a frame-based signal are said to be made up of discontiguous frames when the samples in one frame are not contiguous or adjacent in time to the samples in the previous and next frames. Such frames are generated either when there is an overlap or a gap in the samples from one frame to the next, or when the samples from one frame to the next are independent and have no sequential relationship between them. The latter may be common when the frames correspond to a signal that is produced by a block that is transforming its input signal to another domain, such as, for example, the frequency or cepstral domain.

Frames may be created by various model elements by formatting their output data into frames. Alternatively, a frame may be created by a frame-making element. In a modeling environment equipped with a time-based model of computation, a frame-making element such as buffer component may create a frame based on the rate of the incoming data samples, ri, the size of the frame, fn, and the rate at which the frame is created, ro. If conservation of the data samples is required, only two degrees of freedom between ri, ro, and fn exist. For example, for a given input rate, ri, and a frame size, fn, the output rate, ro, can be computed as ro=ri/fn. Similarly, given ri and ro, fn can be computed as fn=ri/ro, while also ri=fn*ro.

In general, however, all three variables are variable and discrepancies may be resolved by, for example, inserting or removing data samples. For example, in case of ri=1, ro=1 and fn=2, the first time the frame with two elements is assembled, it will only have one data sample available. One of the two frame elements may then be chosen to be the available data sample while the other frame element may be chosen to have a default value such as 0. Alternatively, both frame elements can be assigned the value of the available data sample or a special value such as, for example, −1 or 1.

Another example of a discrepancy is the parameter set ri=4, ro=1, and fn=2. In this case, more data samples are available than strictly needed. One solution may be to remove data samples, for example by assigning only the last two samples to the frame. Alternatively, the first two data samples can be chosen, the first and last, etc., even the last data sample can be chosen for both elements of the frame. Note that such permutations can also be applied in the case where the selection of the three degrees of freedom adheres to the ri=fn*ro formula.

Another example of a discrepancy is the parameter set ri=1, ro=3, and fn=2. In this case, less data samples are available than strictly needed. One solution is to add data samples, for example by choosing one data sample for multiple elements of the frame. Alternatively, some elements of the frame may be chosen to have a default value as described above.

In a modeling environment equipped with an alternative model of computation, such as a dataflow modeling environment, a frame-making element may create a frame based on the availability of input data samples, producing an output only when all data inputs are made available to the component.

Many more such schemes to create a frame from a number of data samples exist and will be apparent to those skilled in the art. Which scheme to apply to obtain a frame from sampled data can be implicit in the elements of the graphical modeling environment. Alternatively, it can be selected explicitly by the model designer, for example by means of a dialogue.

Frame-based processing may be expressed not only in a graphical, but also in a text-based model. Similarly, the HDL code may be generated from either a text-based or a graphical model. The illustrative embodiment generates HDL code from a graphical model, such as a block diagram model, a state transition diagram, and/or a Petri net. One of skill in the art will appreciate that the block diagram model is illustrative and the present invention can apply to other graphical models, such as data flow models and Unified Modeling Language (UML) models. The illustrative embodiment can also generate HDL code from a text-based model, such as a model designed using, for example, Filter Design Toolbox from The MathWorks, Inc. of Natick, Mass. In an alternative embodiment, HDL code may be generated directly from text-based code, such as, for example, M-code of the MATLAB® programming language from The MathWorks, Inc. of Natick, Mass., or any other language, including languages wherein at least a portion of the language is compatible with MATLAB.

An alternative embodiment may generate an intermediate representation of the textual or graphical model before generating the HDL code. Such intermediate representation may simplify the generation of the HDL code or may serve as a common source for multiple target platforms. The intermediate representation may be modified—either by a user or by software—before the HDL generation step.

An "intermediate representation" is used herein to refer to a representation, such as a data structure that is stored in memory, in a file, in a database, or any other storage medium, and that is constructed from input data contained within a source language and from which part or all of the target language data is constructed in turn. The intermediate representation of the present invention further allows for the serial and parallel processing of the representation in the source language within the individual intermediate representation. In one embodiment of the present invention, the use of an intermediate representation allows for the translation of a representation in a source language to a representation in a target language such that a system implementation can be generated from an initial system model.

An exemplary model for HDL generation may be created in the Simulink® modeling environment, which provides tools for modeling and simulating a variety of dynamic systems in one integrated, graphical environment.

Dynamic systems can be modeled in simulation environments as sets of differential, difference, and/or algebraic equations. These equations can be either in explicit or implicit form. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing configuration of the system. For instance, a signal-processing system that filters a signal would maintain a set of previous inputs as the state. The system parameters are the numerical representation of the static (unchanging) configuration of the system and may be viewed as constant coefficients in the system's configuration.

The sample time is the time interval at which the inputs, state, or outputs (collectively referred to as the results) of the system are traced as time progresses. A discrete-time system is a system in which the evolution of the system results is tracked at finite intervals of time. In the limit as the interval approaches zero, the discrete-time system becomes a continuous-time system. The intervals of time may be periodic or non-periodic. Sometimes non-periodic rate systems are referred to as non-uniform rate systems, meaning that there is no periodic rate at which the response can be tracked. Non-uniform-rate systems can fall into the class of composite systems where an additional equation (GetTimeOfNextVarHit) defines when in the future the other equations associated with the system should be evaluated.

If a system has only one sample time, it is said to be single-rate. If a system has multiple sample times, it is said to be multi-rate. Multi-rate systems can be evaluated (executed) using either a single-tasking form of execution or a multi-tasking form of execution.

Mathematical models for dynamic systems can involve a complex set of mathematical transformations applied in some prescribed manner with the outputs of some transformations forming the inputs of others. Each elemental transformation may be viewed in isolation as a dynamic system falling into one of the categories listed above. A schematic representation of such an interconnection is the block diagram.

The Simulink® modeling environment extends the classic block diagram models by introducing the notion of non-virtual blocks and virtual blocks. Non-virtual blocks are elementary dynamic systems. A virtual block is provided for graphical organizational convenience and plays no role in the definition of the system of equations described by the block diagram model. Examples of virtual blocks are the Bus Creator virtual block and Bus Selector virtual block which are used to reduce block diagram clutter by managing groups of signals as a "bundle". Virtual blocks may be used to improve the readability of models.

Those skilled in the art will also recognize that block-diagram packages offer scripting languages for writing out programs that automatically carry out a series of operations that would normally require interaction with the GUI. For example, Simulink® offers a set of commands in MATLAB® for carrying out operations such as block addition (add_block), block deletion (delete_block), starting and terminating execution (set_param), modifying block attributes (set_param/get_param), etc.

A typical base data-structure for a block contains data that fall into four categories, a graphical attributes field, a functional attributes field, a compiled attributes field and an execution data field.

If a block is an elemental discrete-time system, then the block sample time attribute specifies the spacing between time instants at which the block response should be traced. A restrictive flag disallows the use of blocks in certain modeling contexts. For example, one may impose the restriction that there may only be one instance of a given block in a model.

Attributes of block ports specify properties of the data that is either available or produced at that port. Block port attributes include dimensions, data types, sample rates, and direct feedthrough. Dimension attributes are individual dimensions of a multi-dimensional matrix that is used as a container for data elements. Data type attributes are the data type of each element of data in the data container. A complexity attribute is a flag to specify if each data element is real or complex. A sample rate attribute specifies how often the signal corresponding to an input or output port will be used. The port sample times may sometimes be used to implicitly infer the block's sample time. The direct feedthrough attribute can be specified for input ports only and indicates whether or not the Output and/or GetTimeOfNextHit equations of the block are a function of the given input. This attribute helps in determining the sequence in which block methods should be executed while executing the block diagram.

Modularity may be achieved in a block diagram by layering the block diagram through the use of subsystems. A subsystem facilitates layering by allowing a collection of blocks to be represented by a single block with input and output signals. The input and output signals of the subsystem are accessible to the constituent blocks within the subsystem. A subsystem is a virtual subsystem if its constituent blocks are moved back into the main block diagram model during the model's execution. Within a virtual subsystem graphical entities, called inport and outport blocks, are provided to define signal connections to the parent block diagram.

Before generation of the HDL code or a simulation, a model may be compiled. The compile stage marks the start of model execution and involves preparing data structures and evaluating parameters, configuring and propagating block characteristics, determining block connectivity, and performing block reduction and block insertion. The compilation may produce an Intermediate Representation (IR) later used in generating the HDL code, or a compiler may directly produce HDL code.

During the configuration and propagation of block and port/signal characteristics, the compiled attributes (such as dimensions, datatypes, complexity, or sample time) of each block (and/or ports) are setup on the basis of the corresponding functional attributes and the attributes of blocks (and/or ports) that are connected to the given block through lines. The blocks may also be connected by other characteristics. For example, if all sample rates are inherited, the step size of the selected numerical solver may be assigned as the compiled sample rate.

The attribute setup is performed through a process during which block functional attributes "ripple through" the block diagram from one block to the next following signal connectivity. This process (referred to herein as "propagation"), serves two purposes. In the case of a block that has explicitly specified its block (or its ports') functional attributes, propagation helps ensure that the attributes of this block are compatible with the attributes of the blocks connected to it. If not, an error is issued. For instance, if an Integrator block is implemented to only accept numbers of double precision datatype, then this block will error out if it is driven by a block that produces single precision data, unless the user has asked for an implicit data conversion. Secondly, in many cases blocks are implemented to be compatible with a wide range of attributes. Such blocks adapt their behavior in accordance with the attributes of the blocks connected to them. This is akin to the concept of polymorphism in object-oriented programming languages. Included within this step are other aspects such as validating that all rate-transitions within the model yield deterministic results and that the appropriate rate transition blocks are being used. Propagation is one way of resolving the attributes, but other approaches, such as the use of constraint satisfaction problem solvers and/or optimization techniques may be used.

Once actual block connectivity has been determined (by removing the virtual blocks) the block diagram may be further optimized by performing block reduction and insertion.

Figure 5:
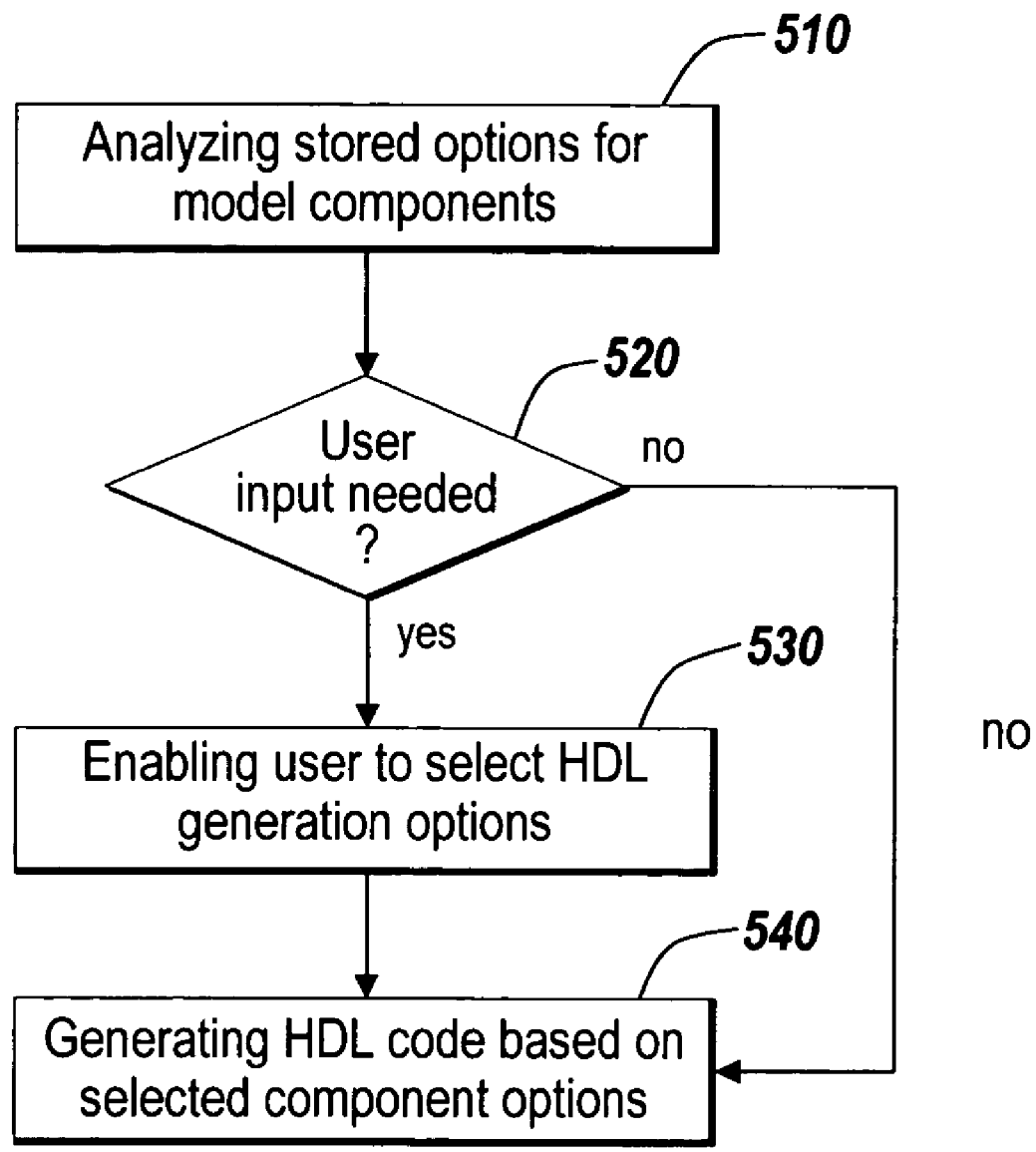
FIG. 5 is an exemplary frame-based model.

During this step, non-virtual blocks may be inserted or a set of non-virtual blocks may be completely removed or reduced to a single or multiple equivalent block(s). A Gain block is a block that multiplies its input value by a gain parameter, such as a simple amplifier. For example, FIG. 5 depicts the replacement of a collection of blocks connected in an accumulator pattern with an equivalent synthesized block representing the accumulator pattern leading to the same result. A signal copy block may also be automatically inserted in order to make contiguous memory copies of signals that are made up of disjoint memory sections. Block insertion and reduction may also be performed at other suitable stages of compilation.

The generated IR code may be instructions in a high-level software language such as C, C++, Ada, etc., hardware descriptions of the block diagram portions in a language such as HDL, or custom code formats suitable for interpretation in some third-party software. Alternatively, the code may be instructions suitable for a hardware platform such as a microprocessor, microcontroller, or digital signal processor, etc., a platform independent assembly that can be re-targeted to other environments, or just-in-time code (instructions) that corresponds to sections of the block diagram for accelerated performance. Those skilled in the art will recognize that when users generate code, they may choose to not proceed further with the block diagram's execution. They may choose to take the code and deploy it outside of the confines of the modeling software environment.

There are several forms of target code execution known to those skilled in the art such as Rapid Prototyping, Embedded System Deployment, Processor-in-the-Loop and Hardware-in-the-Loop which execute a model or portions of a model via the generated code on a real-time system target. External Mode refers to a system where the Simulink® modeling environment acts as a monitor and debugger of the generated code running in real-time on a target. In External Mode, users can change parameters and view signals via standard Simulink® elements.

Another aspect of the code generation technology is that it is very extensible. Provided with the Simulink® product family is the Target Language Compiler (TLC). This technology enables the creation of "active scripts" that control how the generated code is produced for a block diagram. In an alternative embodiment, using TLC, one can tailor the generated code to suit their specific needs.

Simulink® software enables users to design a block diagram for a target system, simulate the system's behavior, analyze the performance of the system, and refine the design of the system. Simulink® allows users to design target systems through a user-interface that allows drafting of block diagram models of the target systems. The Simulink® or an alternative modeling environment may also allow for processing a model originally designed in UML or SysML to generate its implementation both for modeling and test and design purposes, and for the purposes of generating an HDL representation. The HDL implementation of a UML or SysML model may involve frame-like processing where appropriate.

The illustrative embodiment provides for the automatic HDL code generation for components and interfaces in a model. In the generation of HDL code for components capable of frame-based processing, various options may be provided for the multiple types or styles of proposed hardware component implementation. For example, one element may be configured for a lower implementation area, power draw or latency, or for a higher throughput. The options may include options for optimizing various hardware or HDL implementation parameters on an element-per-element or a model basis. The selection of element or interface types or styles may be inferred from types of individual elements or may be explicitly directed by the user. In an alternative embodiment, the user or an additional software component may provide proposed HDL code for one or multiple elements of the model.

FIG. 1 is an exemplary computing device 100 suitable for practicing the illustrative embodiment of the present invention. One of ordinary skill in the art will appreciate that the computing device 100 is intended to be illustrative and is not limiting of the present invention. The computing device 100 may be an electronic device including, but not limited to, a workstation, server, network computer, Internet appliance, mobile device, a pager, a tablet computer, multiple computers connected over a network, a multi-processor computer, a quantum computer, and a bio-computing device.

The computing device 100 includes a network interface 160, a modem 150, storage 130, memory 120, a central processing unit (CPU) 110, a display 170, an input control 140, a keyboard 180 and a mouse 190. One of ordinary skill in the art will appreciate that the computing device 100 may be connected to communication networks using the modem 150 and network interface 160. Modem 150 may be any networking device, including, but not limited to, an Ethernet-enabled adapter, a wireless adapter, an analog modem, etc. The network interface 160 and the modem 150 enable the computing device 100 to communicate with other computing devices through communication networks, such as the Internet, an intranet, a LAN (Local Area Network), a WAN (Wide Area Network), a MAN (Metropolitan Area Network), and any number of other virtual and non-virtual network configurations.

The CPU 110 controls each component of the computing device 100 to run software tools for generating HDL code from a model containing one or more frame-enabled elements. The computing device 100 receives input commands necessary for generating HDL code, such as the selection of HDL code languages, through the keyboard 180 or mouse 190. The computing device 100 may display the options for the types of target hardware implementations of model elements capable of processing frames of input. The memory 120 temporarily stores and provides to the CPU 110 the code that needs to be accessed by the CPU 110 to operate the computing device 100 and to run the software tools. The storage 130 usually contains software tools for applications. The storage 130 includes, in particular, code 131 for an operating system, code 132 for applications, such as a code generator 230 and code 133 for data including the model and HDL code generated from the model. The code generator 230 will be described below in more detail with reference to FIG. 2.

Figure 2:
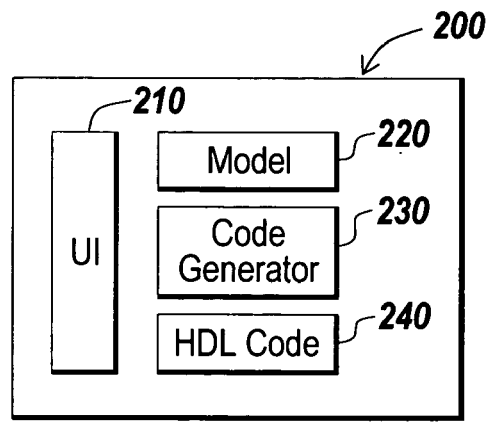
FIG. 2 is an exemplary environment for generating code from a model in the illustrative embodiment of the present invention.

FIG. 2 shows an exemplary environment 200 for generating HDL code 240 in the illustrative embodiment of the present invention. The environment 200 may be a modeling environment in which a model 220 can be created, simulated, executed and/or tested. In an alternative embodiment, environment 200 may be a model viewer environment, restricting some operations on the model, but allowing model navigation. The environment 200 can include a user interface 210 and a code generator 230. The user interface 210 can include a graphical user interface (GUI) and/or command line interface (CLI) for allowing users to create the model 220 and enabling the code generator 230 to generate HDL code 240 from the model 220. The input may be, for example, data for selecting the language of the HDL code 240, such as VHDL, Verilog, or other versions of HDL. The user interface 210 allows users to input parameters to select or define the optimization goals in generating HDL representations for elements capable of processing frames of input data in the model 220. The code generator 230 generates the HDL code 240 based on the data entered or selected by the users using the user interface 210.

An exemplary code generator 230 may be Simulink® HDL Coder from The MathWorks, Inc. of Natick, Mass. The Simulink® HDL Coder generates hardware description code that may then be used for actual hardware implementation or, alternatively, for further model optimization, simulation, design and testing. Code that is generated for parts of the model may also be interfaced with the original model.

By using the automatic HDL code generation, system designers may focus their effort on model design and testing using software tools and spend less time describing target hardware by hand. In an alternative embodiment, code generator 230 may generate code for part of the model, while the rest of the HDL code may be supplied by a model designer or a user. If code is generated for a part of the original model, the generated code may be tested in the system context, rather than requiring a separate test bench. In yet another embodiment, the user may fine-tune the automatically generated HDL code.

Figure 3:
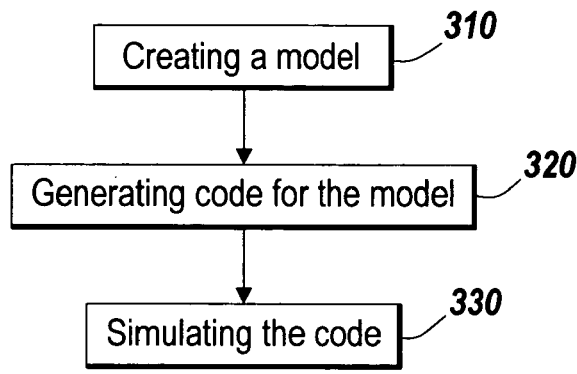
FIG. 3 is a flow chart showing an exemplary operation for generating code from a model in the illustrative embodiment of the present invention.

FIG. 3 depicts an exemplary operation for generating HDL code 240 from a model 220 in the illustrative embodiment of the present invention. The model 220 can be created using the user interface 210 in the environment 200 (step 310). The model 220 created in the environment 200 may be either a text-based or a graphical model. The graphical model may be generated using a graphical model design tool, such as, for example, Simulink®. One of skill in the art will appreciate that the present invention is not limited to the Simulink® graphical environment, and alternative embodiments may be implemented in conjunction with other graphical model design tools or as stand-alone components. Examples of graphical programming environments include, but are not limited to, Simulink®, LabView®, Hyperception, Signal Processing Designer, VEE, VisualSim, SCADE, etc. Graphical model design tools may include data flow modeling tools, state chart design tools and Unified Modeling Language (UML) design modeling tools, as well as any number of UML variants or similar languages, for example, SysML. The text-based model may be generated using a text-based model design tool, such as, for example, Filter Design Toolbox, MATLAB® software, or any other environment capable of being used to generate text, graphical, or combination of text and graphical models.

Figure 4:
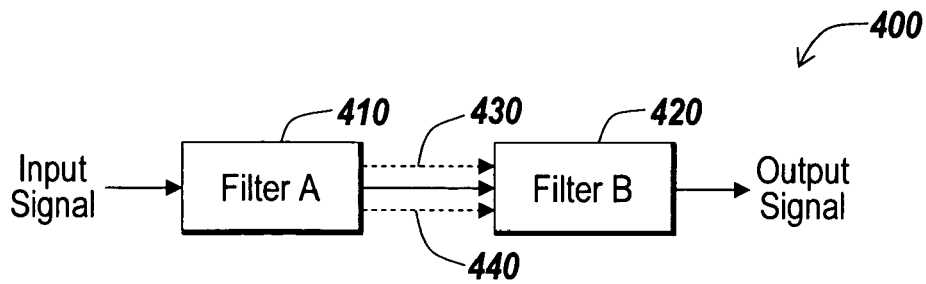
FIG. 4 is an exemplary model from which hardware description language (HDL) code is generated in the illustrative embodiment of the present invention.

FIG. 4 is an exemplary model designed in the illustrative embodiment. The model 400 includes two components (or elements) including filter 410 and filter 420. The components of the model 400 depicted in FIG. 4 are illustrative, and the model 400 may include more than two components or elements. The components of the model 400 may be adapted to receive frames of data as input and/or to output data as frames. Not all components of the model 400 need to be frame-capable, and there may be one or more components providing transition between frame signals and non-frame signals between different elements. A frame of input can be thought of as multiple inputs, referred to as channels, organized into one logical unit. Each of the channels may, in turn, include multiple samples of data. Channels of data 430 and 440 are represented in FIG. 4 as dotted lines. Typically these lines would not be visible to a user in the graphical model representation and a frame of input would be represented as a single line. An alternative embodiment may employ different visual and/or textual representations for signals carrying frames of data.

Referring back to FIG. 3, the code generator 230 generates HDL code 240 from the model 220 (step 320). When the HDL code 240 is generated for the model 240, such as the model 400 having filter 410 and filter 420 as its components, the code for component interfaces between the components of the model 220 may also be generated. In one embodiment, the size of the input frame for a first component may be inferred from the size of the output frame for another component feeding the input for the first component. In an alternative embodiment, the HDL code may be generated to describe target hardware that includes a shared buffer into which one component feeds its output, and from which another component may draw data for its input. Using buffers for holding one or more frames of data is discussed in conjunction with FIG. 7.

FIG. 5 is a flow chart showing an exemplary operation of HDL code generator 230 for generating HDL code for components capable of accepting frame-based input. First, the HDL code generator 230 may analyze stored options and/or preferences for processing frame-capable elements. Such options may be set on an element per element basis or for the whole model. Some elements may provide a variety of options for HDL code generation, in particular, such as parallelizing or serializing the processing or a combination of the two. For an example of such an element, see FIGS. 7-9. Yet other elements may be particularly difficult to parallelize and thus provide fewer HDL implementation options. In an alternative embodiment, one or more model elements may contain annotations for optimal selection of options and design parameters. The user may be able to override those pre-selected options or may be limited to accepting them. Also, the options may be automatically inferred from model characteristics.

Among various options for HDL generation, are design tradeoffs, such as:
latency and/or clock speed
power consumption;
implementation area of the target hardware.

While it may be preferable to achieve low latency in conjunction with low power consumption and small implementation footprint, satisfying all those constraints may not be possible, and the HDL code generator may need to select one or more options for maximizing, while relaxing constraints on other parameters. While it is often possible to satisfy a requirement such as "having a small footprint," the resulting footprint may be not a minimal one. This may be accomplished by, for example, minimizing a cost function that includes the criteria with a certain weight associated with each of them to indicate their relative importance.

If there is not sufficient information in the environment 200 for all necessary options for HDL generation, as determined in step 520, the environment 200 may provide users with options for the types or styles of frame-based component implementations. The types or styles may define different characteristics for the component implementation in the model 440.

The users may be able to select one or more options for the HDL frames implementation in the model 400 (step 520). In the illustrative embodiment, the selection of implementation may be directly controlled by the user using the interface 210. In another embodiment, the selection of the target hardware implementation types or styles may also be inferred from other parameters that the user has selected, as well as selections for other components. For example, if the user has selected to optimize parallelization of the filter 410, the same selection may be inferred for the filter 420. In an alternative embodiment, the user may be able to set such preferences and options as part of the model design. In yet another embodiment, the optimal selection of the options may depend on the type of the target hardware for the model element implementation, and may be supplied by third parties.

Once the options for the target hardware implementation and/or HDL code have been selected, the HDL coder 230 generates HDL code in step 540. The generation of the HDL code may proceed by selecting one or more design parameters to optimize first, choosing the parameter values, and then proceeding to maximize a second parameter, etc. In an alternative embodiment, the HDL coder 230 may explore various points in the design space, analyzing various benefits and downsides of each viable point. This analysis may be done by computing a cost function based on the selected options and then searching for the point in the design space that would minimize the cost function.

In an alternative embodiment, the HDL coder 230 may generate multiple proposed HDL implementations and present them to the user for further review and selection. In yet another embodiment the HDL coder 230 may analyze the model and selected options to determine if there are any inconsistencies or to locate and suggest various optimizations. For example, if a first element outputs data of known format and such data may be stored more optimally than what is presupposed by another element accepting the input from the first element, the analysis may result in suggesting a more optimal implementation for the second element. Examples of data-specific implementations are discussed in conjunction with FIGS. 6A-B.

A frame of data may then be logically represented as a matrix of data samples, where the number of rows in the matrix is the number of channels in one frame and the number of columns in the matrix is the largest channel size in the frame. It will be apparent to one of skill in the art that the frame representation need not be as described above and may be adapted in whichever way appropriate for a particular embodiment. In particular, sparse matrix representations may be employed, for example.

Figure 6A:
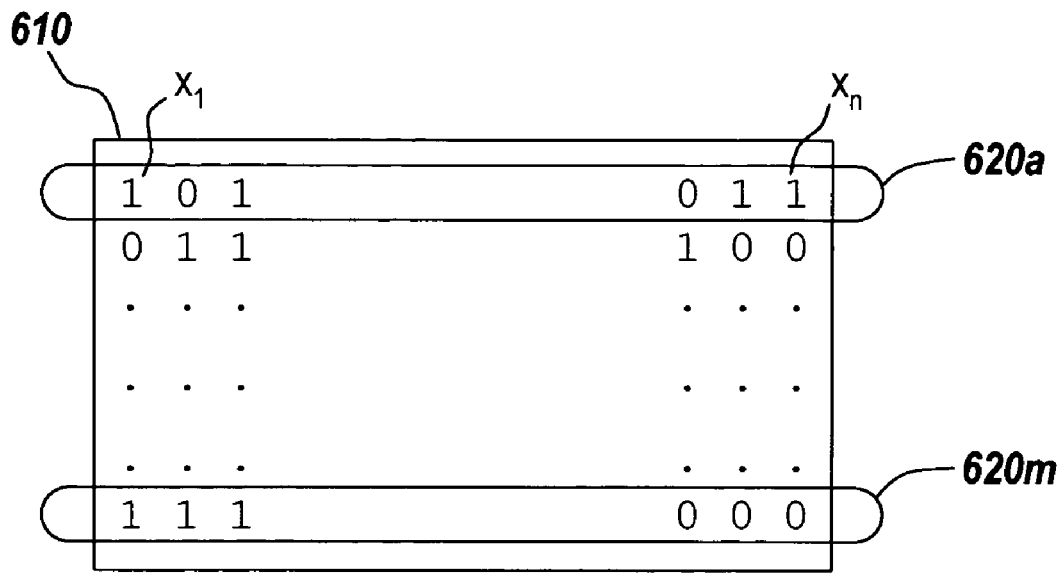
FIGS. 6A-6B are examples of a frame of data.
Figure 6B:
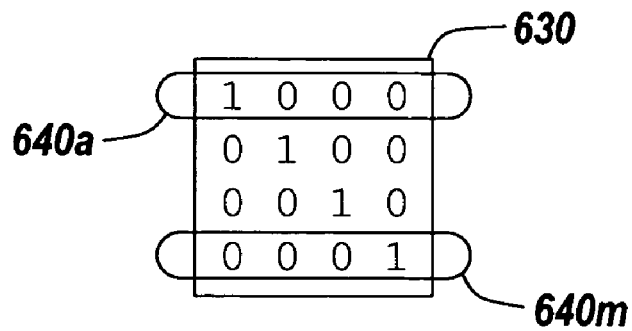

FIG. 6A illustrates such a representation of frame data. Frame 610 has m channels 620*a*-620*m*, each with n elements x1-xn. Individual data samples need not be ones and zeroes as in FIG. 1. Each individual data sample may be an object, a variable, a data structure, or a combination of any of the above. The present invention is not limited to having the same number of samples in each channel of the same frame. In one embodiment, some elements of the model may be able to process frames with unequally sized channels. The elements in different channels or even elements in the same channel may be of different types and sizes.

In the process of generating HDL code for the model and, possibly, in generating hardware, it may be necessary to convert this logical representation into real implementation that is capable of handling multiple samples of data. One embodiment converts frame based functionality to a form amenable to HDL implementation, possibly without even considering all the design trade-offs. Some elements may be easily adapted for handling multiple samples of data at the same time, while others may be difficult to parallelize and may work on at most an individual channel at a time. As such, it may be necessary to store the frame-based input in a buffer or some other functionally storage (which may include a circular buffer). To achieve that, it may be necessary to linearize (or vectorize) the frame. It will be understood by one of skill in the art that different methods of linearizing may be employed, from simple row-column numbering, to specialized schemes designed to take advantage of a known data format. For example, if the frame data matrix is sparse—that is, contains relatively few non-zero elements—specialized data structures and representations designed for sparse matrices may be employed for storing the frame data.

FIG. 6A illustrates a special case of a sparse matrix—an identity matrix, which contains ones along one diagonal and zeroes in all other positions. Data of this format may be more compactly represented using, for example, just an integer to indicate the number of rows and columns in the matrix (correspondingly: number of channels and channel size in the frame). In an alternative embodiment, individual elements expecting input of a particular format, or producing output of known format, may be annotated to indicate optimal HDL code implementations for holding their input/output data.

The output of one element of the model most often acts as one of the inputs for one or more other elements in the model. As such, in the hardware implementation, it may be possible for those elements to share buffers storing data while "in transit" from one to another. Various schemes of handling data hand-off and pick-up known in the art may be employed to achieve proper timing and data synchronization. In an alternative embodiment, the HDL coder 230 may analyze the model to determine whether it is possible to pool parameters and data from individual components, such that more than one element may use the same storage space.

The generated HDL code may be asynchronous. In the asynchronous system, data communications may include a transaction protocol to indicate whether valid data is available or not.

In an alternative embodiment, the individual channels may be implemented as wires in the target hardware implementation and represented as such in HDL code. In that case, the linearization will not be necessary, but there may still be cases where it will be preferable to use a different data representation or to perform transformations on the data to optimize the performance of the components. In some implementations of the present invention, it may be possible to discard portions of data without processing it where appropriate.

Regardless of data storage and transfer options, the HDL code for the components themselves needs to be adapted to processing frame data. In some instances, it may be advantageous to replicate an individual component as many times as there are channels to process them in parallel, in other cases serialization may be a better choice, and in yet other cases the combination of parallelizing and serializing may be employed in order to achieve the optimizations entered as options and parameters for HDL code generation.

Figure 7A:
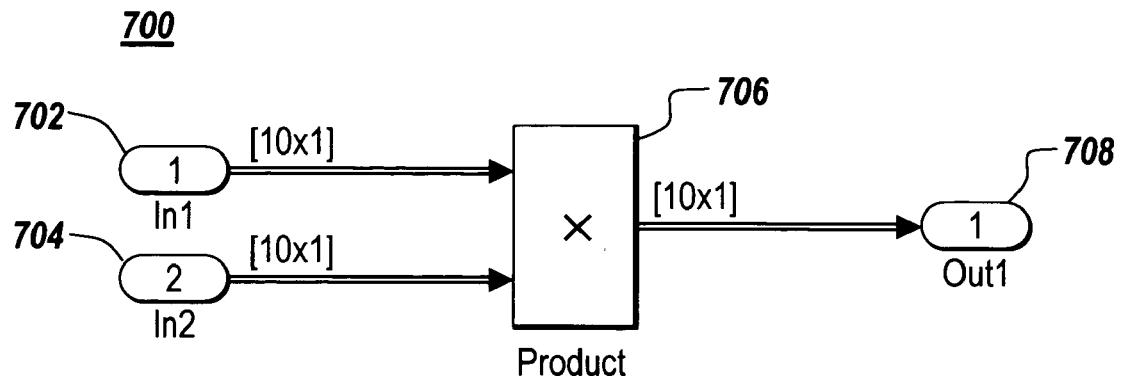
FIGS. 7A-7D are schematic representations of alternative implementations of a multiplier.

FIGS. 7A-D illustrate one model and its possible HDL code implementations and associated design choices. FIG. 7A shows a model of a multiplier 706 that takes inputs 702 and 704 and produces output 708. The inputs 702 and 704 and the output 708 are each frames of size 10×1—ten channels with one sample in each channel per frame. Typically, when an element, such as the multiplier 706 takes frames as an input, it performs operations on elements from different inputs on a channel per channel basis—that is, the multiplier 706 multiplies data from the first channel in the input 702 with data from the first channel in the input 704, data from the second channel in the input 702 with data from the second channel in the input 704, etc. And the output 708 is produced correspondingly. However, in different systems, various components may behave differently and may process and combine elements from different channels in different inputs. In yet other instances, frame-based input may be combined during processing with non-frame input. Individual components may be employed to modify the number of channels in frames and to combine/separate different channels within the frame. Circular buffers may be employed to hold input and/or output data values.

Figure 7B:
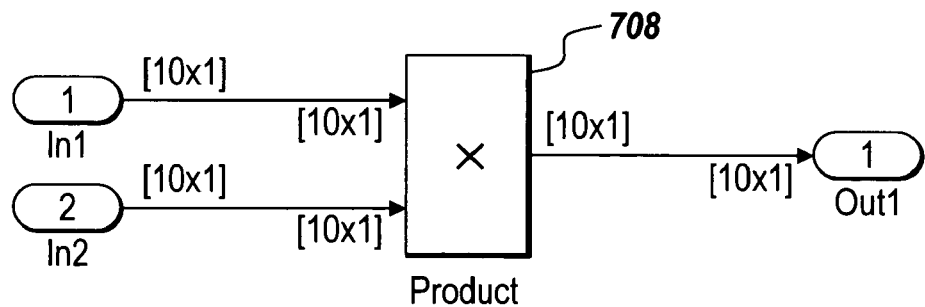

In planning the hardware implementation for the multiplier 706, a hardware designer would have to consider how to handle and process the frame-based input—whether to maintain low latency by replicating a multiplier ten times or to reduce the hardware footprint size by using one multiplier and having it multiply elements in a row. Similarly, the HDL coder 230 may choose among those and other options in generating the HDL code for the multiplier 706. The choices may be made based on the user selection and/or target considerations. Presented in FIG. 7B is a schematic representation of one possible HDL implementation of the model 700. In this implementation, the multiplier 706 is replicated ten times (shown collectively as element 708). The output is produced with the same latency as if the input were not frame-based and there is no need for additional buffers to store data during processing. However, the size of such an implementation is larger than for a single-channel multiplier, yet the power consumption may be less because there is no need to support the additional functionality that is required to switch between channels.

Figure 7C:
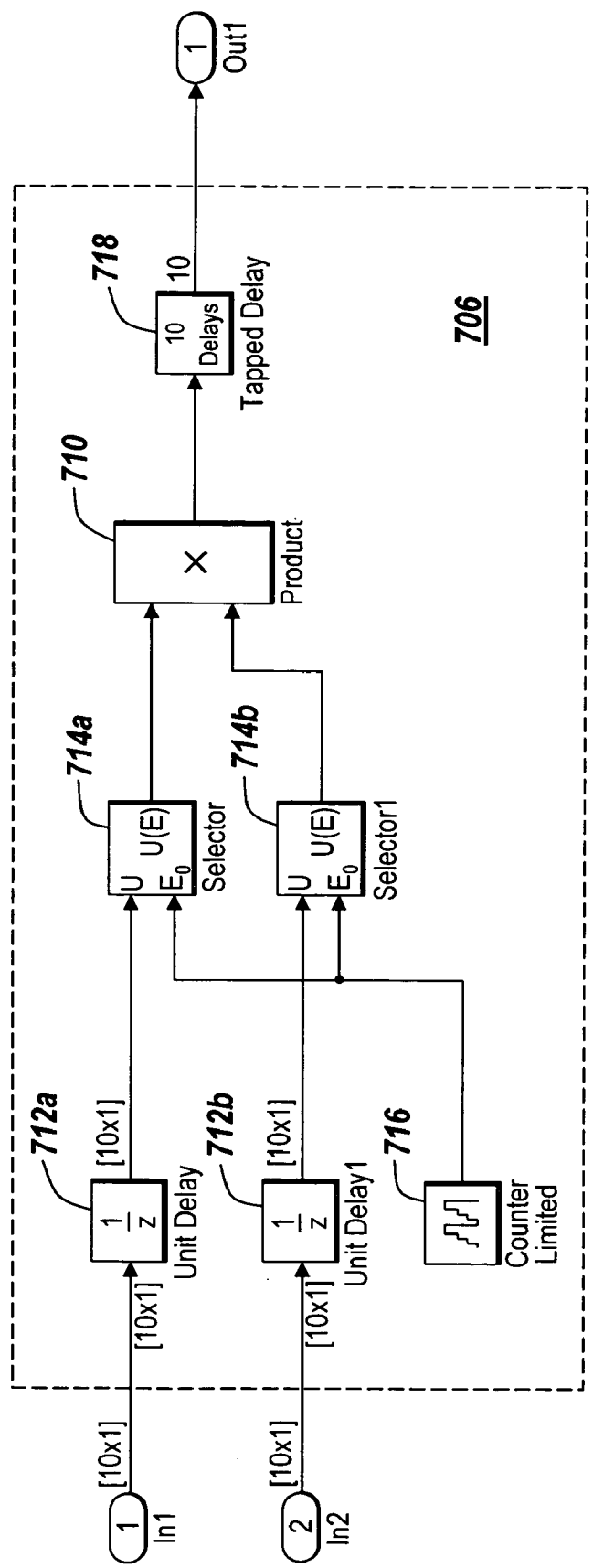

FIG. 7C schematically illustrates another option for implementing the frame-capable elements in the HDL code. The operation of the multiplier 706 is serialized, unlike in FIG. 7B. The serialized multiplier 710 operates on inputs one sample and channel at a time for each input. A different element number is used to represent the multiplier 710 from the multiplier 706 to underscore that the multiplier 710 represents a part of the HDL code implementation of the multiplier 706. The component 706 from the model 700 may be represented in the HDL code as several elements, including the unit delay elements 712a and 712b, counter element 716, selector elements 714a and 714b, multiplier 710 and delay element 718. Serializing is achieved through delaying the input by ten clock cycles using the delay elements 712a and 712b, while the counter 716 updates on each cycle and causes the selectors 714a and 714b to select next channel on each cycle. The results of the selections are operated on by the multiplier 710, the output of which is passed to the tapped delay 718, used to collect the results until all of the channels from the input frames have been operated on.

The advantage of the HDL code implementation shown in FIG. 7C is that it uses less area, that is, fewer resources, in an FPGA or ASIC implementation, but a possible disadvantage is that at least n clock cycles are needed to process input frames of size n. As discussed above, these are the design trade-offs faced in any hardware design, and the final choice may be made based on the options indicating which parameters—design goals—to maximize.

Figure 7D:
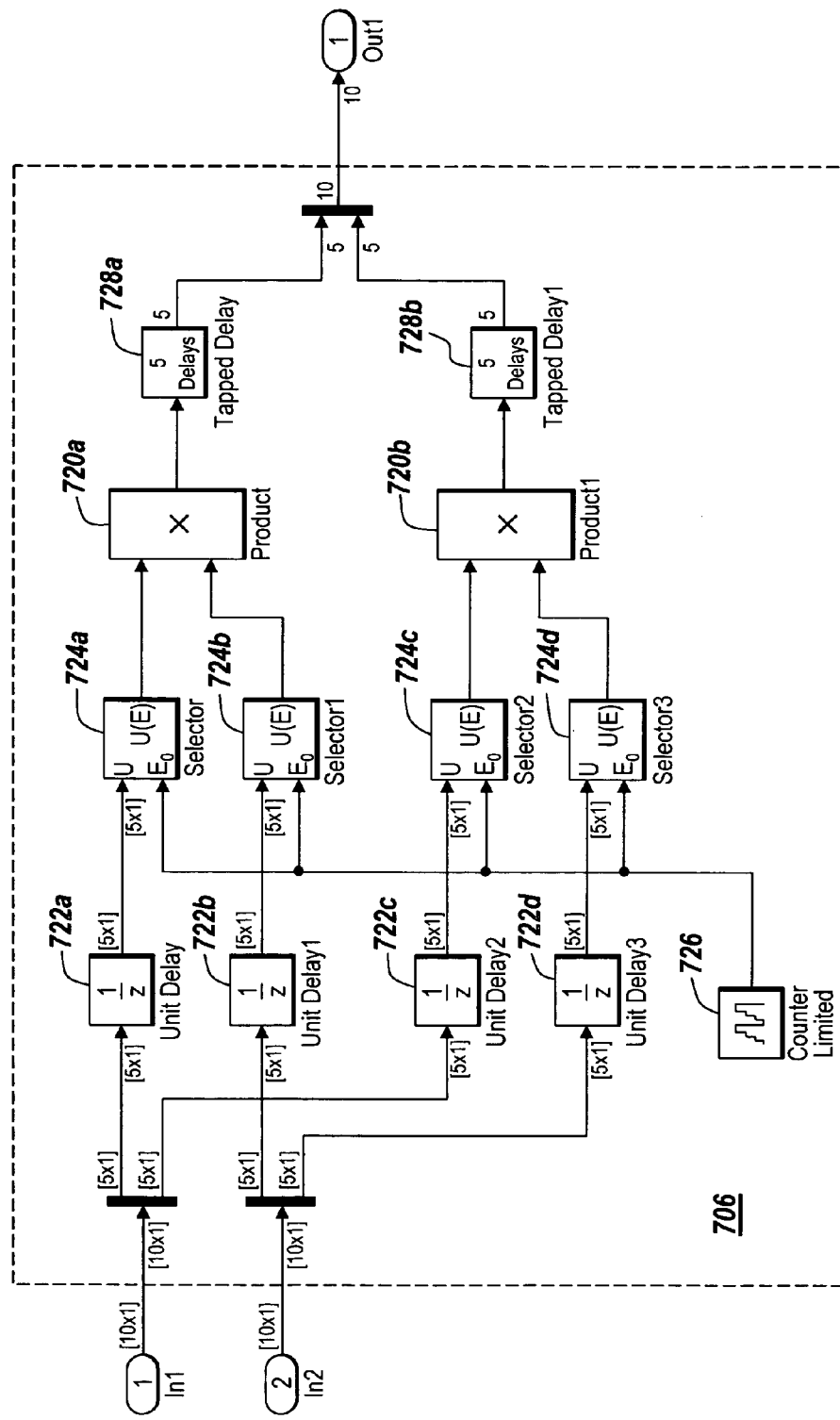

FIG. 7D illustrates yet another option for the HDL code implementation of the multiplier 706. This design combines both parallelizing and serializing to achieve the desired result. The operation of the multiplier 706 is parallelized in that the input frames are each split into two and processing is done in parallel on each half of the input. However, instead of full parallelization, the multiplication is also serialized, such that only two multiplier elements—720a and 720b—are employed, in conjunction with the delay units 722a-d, selector units 724a-d and the counter 726 set to count out five clock cycles. As such, this implementation represents a point in the design space that trades off some benefits of the parallelized implementation for the benefits of the serialized implementation, achieving the desired result according to a particular set of optimization preferences. It will be understood by one of skill in the art that various implementations of the HDL code for the multiplier 706 are not limited to those illustrated herein. Different data division schemes may be used, and different number of multipliers may be employed. The input frame data does not need to be separated equally to be parallelized. In the alternative embodiments, the HDL code generated may indicate that various pieces of the computation take place on different hardware or using different components. Additional variations of serializing and parallelizing may be used, as deemed appropriate by one of skill in the art or as indicated by the user before or during the HDL code generation. For example, in an alternative HDL code implementation of the multiplier 706, input data may be split into two sub-frames, each of size five, with one sub-frame using one multiplier and delays, while other sub-frame being processed on parallelized elements, using five different multipliers. Other divisions and configurations are possible and would be available to the user in the environment 200.

Figure 8:
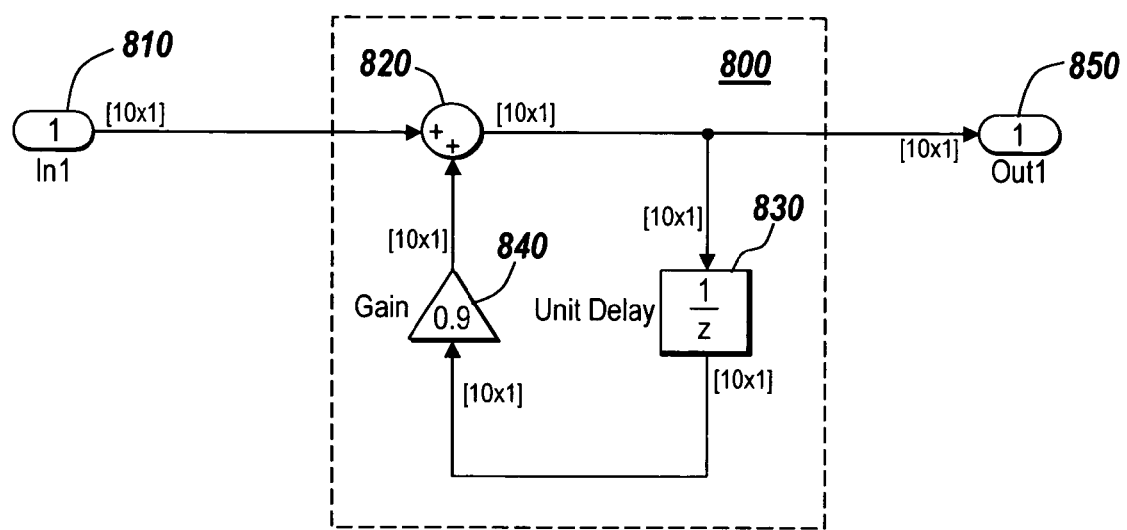
FIG. 8 is a schematic representation of a system that does not have a simple parallel implementation.

Not all components may be as easily parallelized as the multiplier 706. Shown in FIG. 8 is a frame-based model of a discrete integrator 800, which does not avail itself to a simple parallel implementation. If there is a need to generate HDL code handling frame-based input, the only option available may be to serialize the processing of the integrator 800 and to store serialized input and output data in the buffer during the processing.

It will be understood by one of skill in the art that the discussion of parallelization vs. serialization trade-offs herein are not an indication that one is more optimal than the other, and a choice of particular implementation may be made by model designers and HDL coder 230 users. In an alternative embodiment, the HDL coder 230 may generate several possible HDL code implementations of the model or individual elements, and the users may select among them as they see fit. In yet another embodiment, the user may be able to modify the generated HDL code or to supply portions of the HDL code to supplement what has been generated.

In yet another alternative embodiment, the model may be optimized before and/or after generation of the intermediate representation and/or HDL code. Various optimization techniques may be applied to a first intermediate representation and a second intermediate representation may be generated.

Applying optimization techniques to intermediate representations may result in an improvement in the characteristics of the generated code, such as a reduction in execution time or required space. An additional result of applying optimization techniques to intermediate representations may be an increased ability to conform to industrial standards or target environment requirements. Using suitable optimizations increases the likelihood of the compatibility of the generated code with these requirements. Other benefits of applying optimization techniques to intermediate representations may include improved aesthetics and readability of the generated code and improvements in the code generation process itself, including reduced execution times and reduced memory consumption during code generation. Additional elements, such as hyperlinks, optimization comments, additional blocks, etc. may be inserted into the intermediate representation.

Yet another result of applying optimization techniques to intermediate representations may be a reduced size of code generated from the intermediate representation. Another result of applying optimization techniques to intermediate representations is a reduction in the overall size of variables used in the generated code.

A single optimization technique may be applied multiple times. Employing optimizations in the code generation process may improve the efficiency and the effectiveness of the generated code as well as the code generation process itself.

In some embodiments, optimization techniques may be applied prior to the generation of the first intermediate representation, as well as prior to the generation of the second intermediate representation.

A second intermediate representation may be generated responsive to the applying of the at least one optimization technique to the first intermediate representation. The second intermediate representation maintains the algorithmic meaning of the original system model and of the first intermediate representation. The second intermediate representation may be represented by a target HDL. The second intermediate representation may be suitable for processing by a back end of the code generation process. Therefore, a user of the code generation process may employ different optimization techniques depending on the purpose of a particular intermediate representation. In some embodiments an additional intermediate representation may be generated after each application of an optimization technique to the first intermediate representation.

The optimization technique applied may be one of:

Common sub-expression elimination: eliminating a common sub-expression in the intermediate representation.

Lazy code motion: moving a section of code to a location where the section of code is executed. Additionally, moving assignments of local variables closer to the location in the code where the variables will be used results in a reduction of the lifespan of local variables.

Range analysis and value propagation: analyzing a plurality of possible values of variables based on information associated with each variable, such as data types, assignment operations, and preceding conditions in the execution flow, a determination may be made as to whether a particular operation is superfluous or unreachable.

Strength reduction: replacing a vector variable with a scalar variable. This optimization is particularly useful in conjunction with loop fusion optimization.

Dead code elimination: identifying a portion of an intermediate representation that results in generation of unreachable or non-consequential code and removes the identified portions.

Constant folding: calculating a value of a constant expression and replacing the constant expression in the intermediate representation with the result of the calculation.

Loop fusion: combining a plurality of loops having an identical number of iterations into a single loop.

Automatic outlining: when it is detected that the number of operations within a function will exceed the maximal size, outlining optimization may separate some content with this function to a separate function. There are many ways to perform this analysis. In one embodiment, a number of operations are counted from top of the intermediate representation and a separation point is identified when the number of operations in one section reaches a user-identified limit. In another embodiment, the quality of the separation points is calculated based on the amount of data sharing across each point and a set of separation points is selected to fit a maximum size requirement while enabling minimal data sharing as well.

Expression folding: identifying trivial assignments and back-folds these assignments to reduce the number of assignment operations and reduce the number of variables.

Bit compacting: using a bit field to represent Boolean data. A set of Boolean data may be compacted into a bit field structure.

Branch folding: combining a plurality of condition branches having a shared action. When different condition branches have the same action, application of this optimization technique may result in a combined condition statement reducing silicon area of the generated code.

Data creation: using a for-loop to create regular-spaced constant data. For a large regular spaced constant vector, e.g. {0.0, 1.0, 2.0, 3.0, 4.0, 5.0, 6.0, 7.0, 8.0, 9.0}, directly expressed in the generated code can be costly in terms of area. An alternative is to create this constant vector at execution time.

Trivial statement replacement. An application of this optimization technique may result in the identification of a trivial statement and replacement of the statement with an equivalent but simpler form.

Generating an optimally-sized array of memory from which contiguous regions are used and reused for a local variable associated with a function.

Converting a left-recursive expression to a right-recursive expression.

Range determination: automatically reducing a size of a local variable. Through the use of range analysis, an application of this optimization technique may determine the value range of local variables and reduce their word size where appropriate.

Conditional folding: identifying a plurality of expressions having a common if-statement. When the plurality of expressions has been identified, a second intermediate representation may be generated which combines the plurality of expressions into a single conditional.

Globals reuse: identifying a lifespan of a global variable through analysis of the call structure between functions. For a situation using two global variables in which the global variables have non-overlapping life spans, a single global variable may be used and reused.

Optimal local variable scoping: declaring a local variable in the lowest scope possible according to a lifespan of the local variable.

Pointer switch selection: making a determination that all the read operations of the output buffer of the Switch block occur prior to the occurrence of any write operations to input data buffers that are later than the switch selection operation, the switch selection operation may be implemented using a pointer instead of creating a new data buffer.

In some embodiments, techniques are applied to the back end for specific syntax of the generated code. When generating code from an intermediate representation, the back end determines the syntactic layout of the generated code. By controlling and optimizing the determination made by the back end, different styles of code may be generated from a single intermediate representation. This technique provides flexibility for users to customization of the style of generated code such as where to include parentheses naming conventions of variables, comments, etc.

In an alternative embodiment, a user may partition the model to determine a software/hardware trade-off, such as, for example, indicating which parts should be implemented in C or other high-level languages, and which parts should result in generated HDL code. Alternatively, such determination may be made automatically during the generation phase based on user or model preferences or model analysis.

As previously stated a graphical program may be created using one of various programming environments, such as LabVIEW® from National Instruments Corp. of Austin, Tex., and Agilent VEE from Agilent Technologies, Inc., among others. A graphical program may include one or more structure nodes, which are pre-configured nodes for performing corresponding programming actions, such as iteration, sequencing, etc. Exemplary structure nodes in LabVIEW® include a For Loop node, which executes a sub-diagram a set number of times, a While Loop node, which executes a sub-diagram until a condition occurs, a Case Structure node, which contains multiple sub-diagrams only one of which executes depending on an input value, and a Sequence node, which contains multiple sub-diagrams that execute in sequential order. Typically, one or more structure nodes are used together with one or more function nodes in a block diagram.

Figure 9:
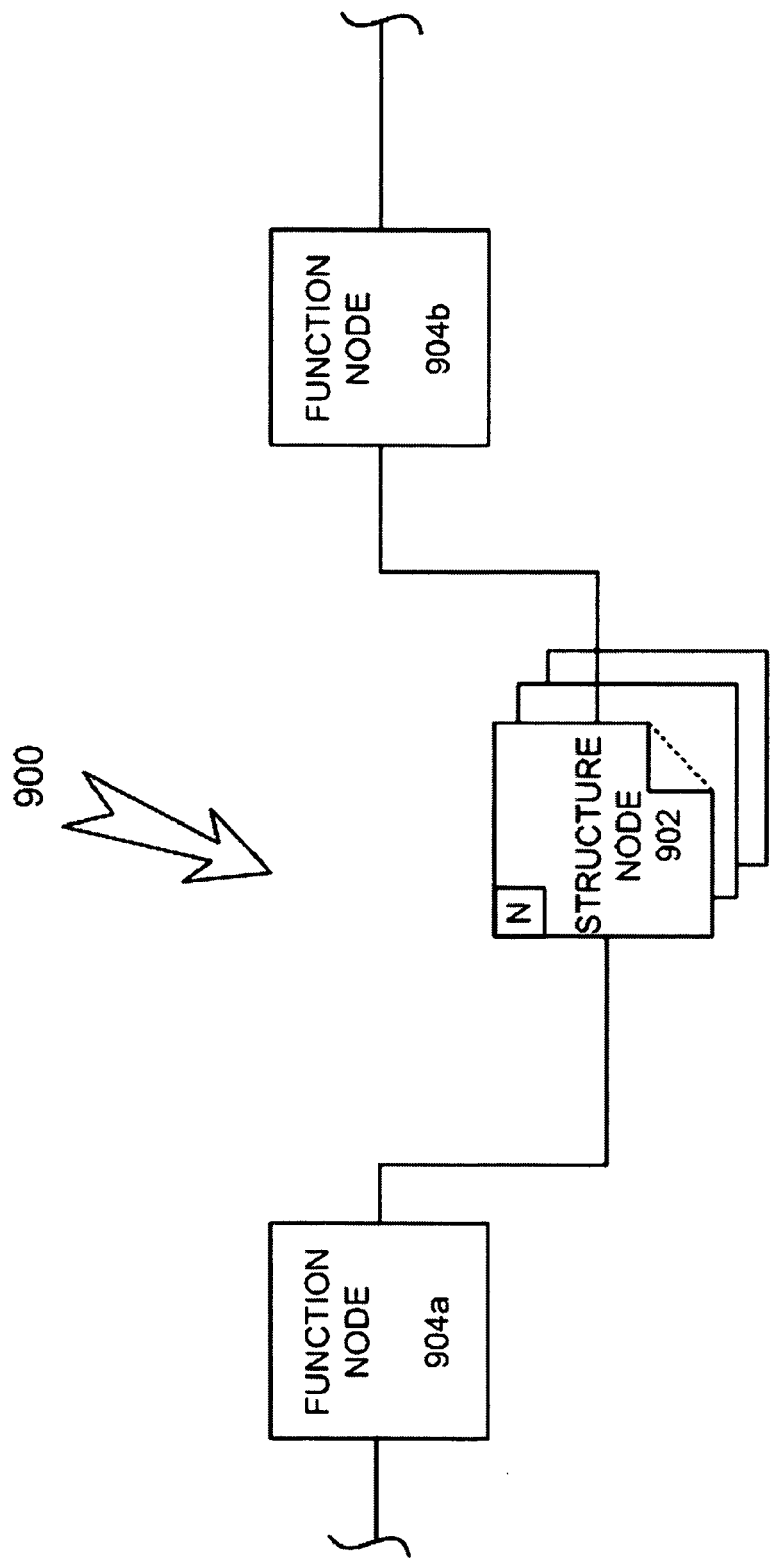
FIG. 9 is a highly schematic illustration of a graphical program in accordance with a preferred embodiment.

FIG. 9 is a highly schematic, partial illustration of a graphical program 900 having a plurality of interconnected nodes. In particular, the graphical program 900 has a structure node 902, which may be a For Loop node, and a plurality of function nodes 904a-b. One of the function nodes, e.g., node 904a, moreover, may be adapted to process frame-based input. The graphical program 900 may model a process.

In an alternate embodiment, the HDL code may be generated from text-based model or program, such as, for example, a program written in a MATLAB® compatible language or another array-based or dynamically-typed programming language. In order to proceed with frame-based HDL code generation, it may be necessary to first identify "frames" in the flow of the program. Some loops may be expressed as processing of a frame of elements, which may then be used for HDL code generation using the same principles and options as described above.

Certain high level operations may be available in hardware. For example, a fast Fourier transform block may be available in hardware and require a frame as input. Similarly, Navier-Stokes equations, for example, can be very efficiently solved by the specific hardware for graphics acceleration that is available on graphics processing units. This hardware may require frame based input.

In an alternative embodiment a system may have reconfigurable input/output (I/O) that can be reconfigured using different HDL descriptions.

Referring back to FIG. 3, the generated HDL code 240 may be simulated to verify the results of the HDL code 240 (step 330). Users may simulate (or emulate) the HDL code 240 using an HDL code simulation tool. The HDL code may be verified using a test-bench generated by the code generator 230. One embodiment may generate HDL representation with instrumentation code included for debugging, profiling, or testing. For production, a new HDL representation may be generated without the instrumentation code In order to verify the functionality of the generated HDL code, the code generator 230 may generate the test bench in many forms, including, but not limited to: VHDL or Verilog HDL code written at a behavioral level; a Simulink® diagram; a MATLAB® function called via a co-stimulation interface, a scripting language file such as a TLC file for the simulation tool; an industry standard value-change-dump (VCD) file that gives inputs, outputs, and the times each are valid. To simulate the generated HDL code 240, users may start the simulation tool and compile the generated HDL code 240 and test bench files in the simulation tool. The test bench connects to the top-level of the generated HDL code. The test bench drives the primary inputs for testing. The test bench checks or verifies whether the outputs are correct at any or all instants of time.

It will also be understood by one of skill in the art that the generated HDL code may be used to aid hardware implementation—whether by directly being used for hardware generation or as a design tool. The HDL code may be adapted for desired target hardware, and design options presented to the user before and/or during the HDL code generation may incorporate design options based on the target hardware characteristics.

It will thus be seen that changes may be made to different embodiments of the invention without departing from the scope of the present invention. It is intended that all matter contained in the above description or shown in the accompanying drawings be interpreted as illustrative and not limiting. For example, the illustrative embodiment of the present invention may be practiced in any other modeling or simulation environment. Alternatively, the HDL code generation may be decoupled from the modeling or design environment, and may proceed from an existing model provided by a user or by a software component. Practitioners of the art will realize that the sequence of steps and architectures depicted in the figures may be altered without departing from the scope of the present invention and that the illustrations contained herein are singular examples of a multitude of possible depictions of the present invention.

The invention claimed is:

1. A computer-implemented method of generating hardware description language (HDL) code for an executable graphical block diagram model of a hardware system, said method comprising:

transforming, using a processor of the computer, a first component of the graphical block diagram model into an intermediate representation, the first component processing frame-based input data and representing a first computational element of the hardware system, wherein a frame is a temporal collection of data samples acquired over a predetermined time period; and serializing at least a portion of the first component, wherein serializing the first component further comprises:

generating HDL code for a buffer storing at least a portion of the frame-based input data to the first component;

generating HDL code for at least one delay unit delaying processing of the at least a portion of the frame-based input data to the first component; and generating HDL code for at least a portion of the first component, the generated HDL code for the at least a portion of the first component including the generated HDL code for the buffer and the generated HDL code for the at least one delay unit.

2. The computer-implemented method of claim 1, wherein the buffer is shared between the first component and a second component, the second component representing a second computational element of the hardware system.

3. The computer-implemented method of claim 2, wherein the buffer is used to hold output of the second component.

4. The computer-implemented method of claim 1, further comprising:

linearizing the at least a portion of the frame-based input data to the first component.

5. The computer-implemented method of claim 1, further comprising:

generating an intermediate representation of the graphical block diagram model.

6. The computer-implemented method of claim 5, further comprising:

optimizing the intermediate representation of the graphical block diagram model; and generating HDL from the optimized intermediate representation of the graphical block diagram model.

7. A computer-implemented system for generating hardware description language (HDL) code for an executable model of a hardware system, said computer-implemented system comprising:
- a model comprising a first component that accepts frame-based input data, the first component representing a computational element of the hardware system, wherein a frame is a temporal collection of data samples acquired over a predetermined time period; and
- generated HDL code for the model, the generated HDL code serializing the first component wherein the generated HDL code serializing the first component further comprises:
  - HDL code for a buffer storing at least a portion of the frame-based input data to the first component; and
  - HDL code for at least one delay unit delaying processing of the at least a portion of the frame-based input data to the first component.

8. The computer-implemented system of claim 7, wherein the buffer is shared between the first component and a second component, the second component representing a second computational element of the hardware system.

9. The computer-implemented system of claim 7, further comprising:
- generated HDL code linearizing the at least a portion of the frame-based input data to the first component.

* * * * *